United States Patent
Yoon et al.

(10) Patent No.: US 9,938,637 B2
(45) Date of Patent: Apr. 10, 2018

(54) PRODUCTION METHOD OF ZEOLITE FILM IN WHICH ONE AXIS IS COMPLETELY VERTICALLY ORIENTED, USING STEAM UNDER SYNTHETIC GEL-FREE CONDITION

(71) Applicant: Industry-University Cooperation Foundation Sogang University, Seoul (KR)

(72) Inventors: Kyung Byung Yoon, Seoul (KR); Cao Thanh Tung Pham, Seoul (KR)

(73) Assignee: Industry-University Cooperation Foundation Sogang University, Seoul (KR)

( * ) Notice: Subject to any disclaimer, the term of this patent is extended or adjusted under 35 U.S.C. 154(b) by 951 days.

(21) Appl. No.: 14/369,973

(22) PCT Filed: Dec. 28, 2012

(86) PCT No.: PCT/KR2012/011807
§ 371 (c)(1),
(2) Date: Nov. 10, 2014

(87) PCT Pub. No.: WO2013/100734
PCT Pub. Date: Jul. 4, 2013

(65) Prior Publication Data
US 2015/0064440 A1    Mar. 5, 2015

(30) Foreign Application Priority Data
Dec. 30, 2011 (KR) .................. 10-2011-0147688

(51) Int. Cl.
*C30B 19/12* (2006.01)
*C01B 39/02* (2006.01)
(Continued)

(52) U.S. Cl.
CPC .............. *C30B 19/12* (2013.01); *C01B 39/02* (2013.01); *C01B 39/38* (2013.01); *C30B 29/34* (2013.01); *Y10T 428/249969* (2015.04)

(58) Field of Classification Search
CPC ..... C30B 18/12; C30B 29/60; B01D 67/0051; B01D 69/10
See application file for complete search history.

(56) References Cited

U.S. PATENT DOCUMENTS 6,582,495 B2    6/2003 Chau et al.
8,153,099 B2    4/2012 Yoon et al.
(Continued)

FOREIGN PATENT DOCUMENTS

JP    2002-316026    10/2002
JP    2008-188564    8/2008
(Continued)

OTHER PUBLICATIONS

Machine translation in English of JP-2008-188564, 11 pages.
International Search Report dated Apr. 8, 2013 in corresponding PCT/KR2012/011807 filed Dec. 28, 2012.

*Primary Examiner* — Matthew Song
(74) *Attorney, Agent, or Firm* — Hovey Williams LLP

(57) ABSTRACT

Provided are a method for preparing a thin film or a thick film, including: a first step of providing a porous substrate capable of supplying silicon; a second step of applying zeolite seed crystals onto the surface of the porous substrate; a third step of coating the seed crystals-applied porous substrate with an aqueous solution containing a structure-directing agent; and a fourth step of forming and growing a film from the seed crystals by the secondary growth above a temperature at which moisture inside the seed crystals-applied porous substrate prepared in the third step can form steam, and a film prepared by the method. The film manufacturing method of the present invention is a simple manu- (Continued)

facturing process, and thus has high reproducibility and high throughput. Since a synthetic gel is not used and a solution is used, the unnecessary consumption of materials, environmental pollution, and waste of a synthetic gel can be prevented while not necessitating drying and washing of a film.

19 Claims, 13 Drawing Sheets

(51) Int. Cl.
*C01B 39/38* (2006.01)
*C30B 29/34* (2006.01)

(56) References Cited

U.S. PATENT DOCUMENTS

| | | | |
|---|---|---|---|
| 8,771,639 B2 | 7/2014 | Yoon et al. | |
| 2005/0014371 A1* | 1/2005 | Tsapatsis | B01D 67/0051 438/689 |
| 2009/0000475 A1* | 1/2009 | Fekety | B01D 53/228 95/105 |
| 2010/0109201 A1* | 5/2010 | Fletcher | B82Y 10/00 264/334 |
| 2013/0216772 A1* | 8/2013 | Yoon | B01D 67/0051 428/131 |

FOREIGN PATENT DOCUMENTS

| KR | 10-0789661 | 12/2007 |
|---|---|---|
| KR | 10-2009-0120846 | 11/2009 |

\* cited by examiner

Micro pattern on Silicon wafer

FIG. 10A
FIG. 10B
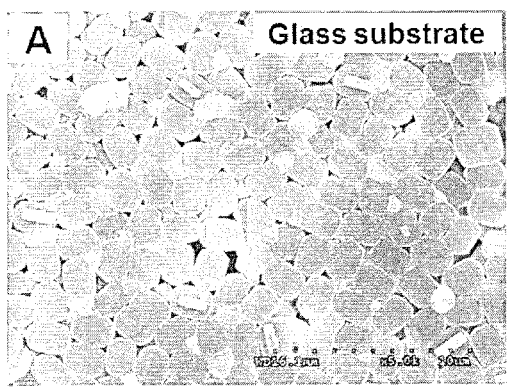
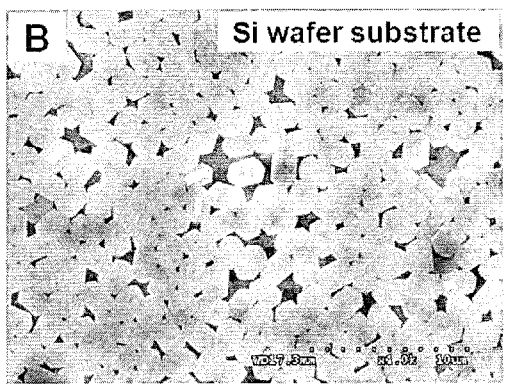
FIG. 11
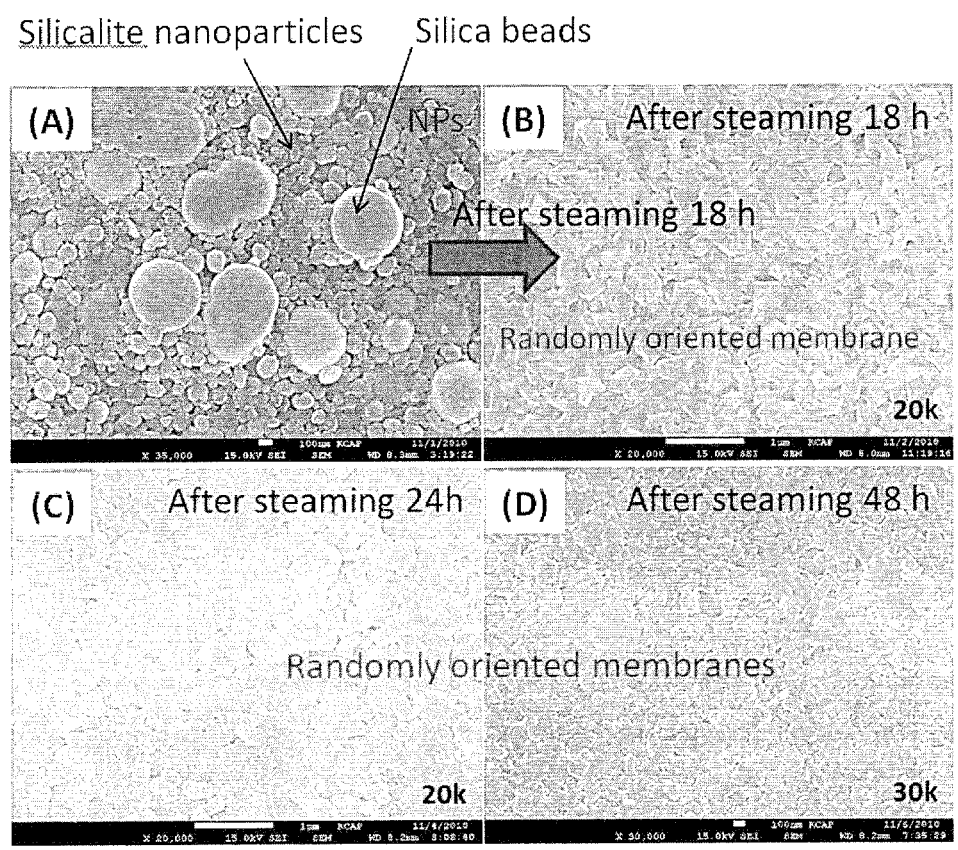

FIG. 12A
Substrate alone
FIG. 12B
After rubbing with 70 nm silica beads
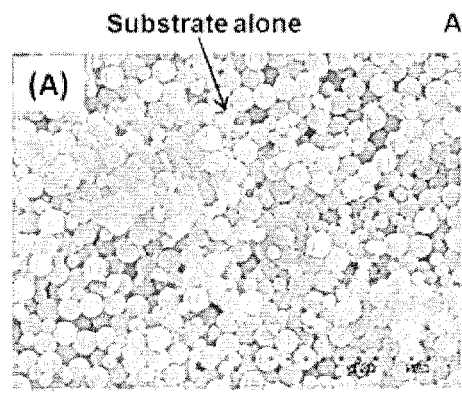
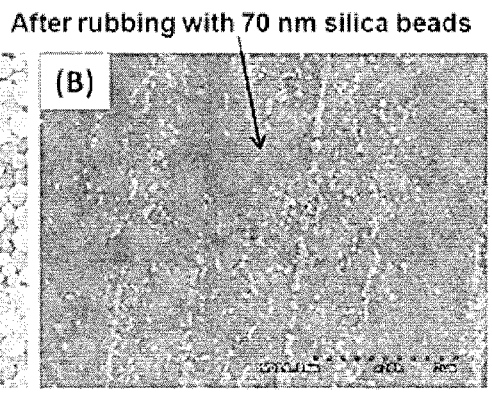
FIG. 12C
FIG. 12D
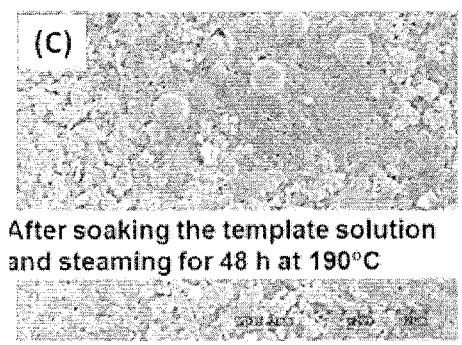
After soaking the template solution and steaming for 48 h at 190°C
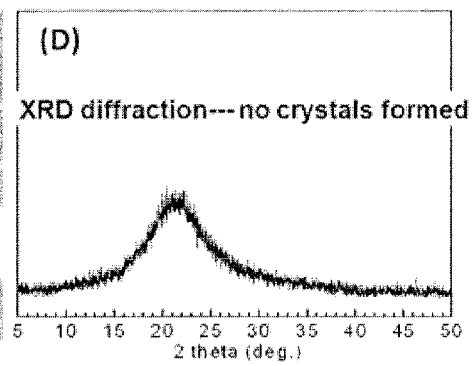
XRD diffraction--- no crystals formed
FIG. 13
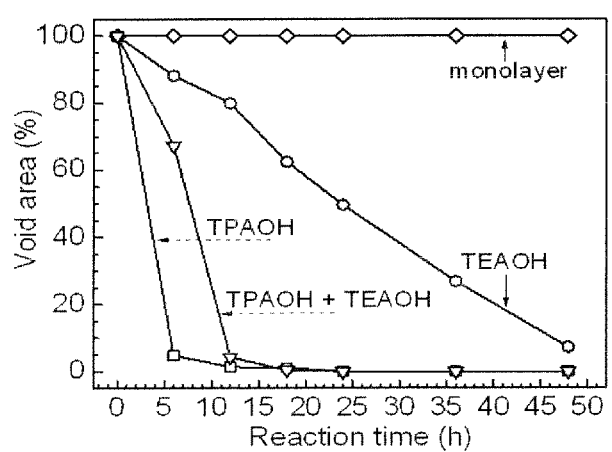

PRODUCTION METHOD OF ZEOLITE FILM IN WHICH ONE AXIS IS COMPLETELY VERTICALLY ORIENTED, USING STEAM UNDER SYNTHETIC GEL-FREE CONDITION

RELATED APPLICATIONS

This application claims priority to PCT International Patent Application No. PCT/KR2012/011807, filed Dec. 28, 2012, which claims the priority benefit to Korean Patent Application No. 10-2011-0147688, filed on Dec. 30, 2011, both of which are hereby incorporated by reference in their entirety.

TECHNICAL FIELD

The present invention relates to a method of producing a zeolite-based film using a secondary growth method in steam without using a gel-type silicon source.

BACKGROUND ART

Zeolite is a generic term referring to a group of crystalline aluminosilicates. Because the sites around aluminum in the framework of aluminosilicate have negative charges, cations for charge balancing are present in the pores, and the remaining space in the pores is usually filled with water molecules. The structure, shape and size of the three-dimensional pores of zeolite vary depending on the type of zeolite, but the diameter of the pores usually corresponds to the molecular size. Thus, zeolite is also called "a molecular sieve", because it has size selectivity or shape selectivity for molecules entering the pores depending on the type of zeolite.

Meanwhile, zeotype molecular sieves in which silicon (Si) and aluminum (Al) atoms constituting the framework structure of zeolite are partially or wholly replaced by various other elements have been known. Examples of the known zeotype molecular sieves include porous silicalite-based molecular sieves free of aluminum, $AlPO_4$-based molecular sieves in which silicon is replaced by phosphorus (P), and other zeotype molecular sieves obtained by substituting a portion of the framework of such zeolite and zeotype molecular sieves with various metal atoms such as Ti, Mn, Co, Fe and Zn. These zeotype molecular sieves, being materials derived from zeolites, do not belong to the zeolite group based on the mineralogical classification but are commonly known as zeolites in the art.

Accordingly, the term "zeolite" as used herein is meant to include the above-mentioned zeotype molecular sieves in a broad sense.

Meanwhile, zeolites having an MFI structure are most commonly used in the art and include the following types:
1) ZSM-5: MFI zeolite in which silicon and aluminum are present in a specific ratio;
2) Silicalite-1: zeolite composed only of silica; and
3) TS-1: MFI zeolite in which aluminum sites are partially replaced by titanium (Ti).

The structure of an MFI zeolite is shown in FIG. 1. In the MFI zeolite, elliptical pores (0.51 nm×0.55 nm) are connected in a zigzag configuration to form channels extending in the a-axis direction, and substantially circular pores (0.54 nm×0.56 nm) linearly extend in the b-axis direction to form linear channels. No channels remain open in the c-axis direction.

Powdery MFI zeolites are very widely used in household and industrial applications, including petroleum cracking catalysts, adsorbents, dehydrating agents, ion exchangers, gas purifiers, etc. MFI zeolite thin films formed on porous substrates, such as porous alumina, are widely used as membranes through which molecules can be separated on the basis of size. Furthermore, MFI zeolite thin films can be used in a wide range of applications, including second- and third-order nonlinear optical thin films, three-dimensional memory materials, solar energy storage devices, electrode auxiliary materials, carriers of semiconductor quantum dots and quantum wires, molecular circuits, photosensitive devices, luminescent materials, low dielectric constant (k) thin films, anti-rusting coatings, etc.

As described above, the pore shape, size and channel structure of MFI zeolites vary depending on the crystal direction.

Meanwhile, methods for producing MFI zeolite thin films on substrates such as glass plates are broadly divided into a primary growth method and a secondary growth method. According to the primary growth method, a substrate is soaked in a gel for the synthesis of MFI zeolite without any pretreatment, and then spontaneous growth of an MFI zeolite film on the substrate is induced. Herein, the gel for synthesis contains tetrapropylammonium hydroxide (TPAOH) as a structure-directing agent or an organic template. In this case, b-axis-oriented MFI zeolite crystals grow perpendicular to the substrate at the initial stage of the reaction. At this time, a-axis oriented crystals begin to grow parasitically from central portions of most of the crystals grown on the glass plate. In addition, with the passage of time, the crystals grow in various directions, and as a result, the final thin film has various orientations. The randomly oriented MFI zeolite thin film is useful in some applications, but its applicability is limited. Particularly, when the randomly oriented MFI zeolite thin film is applied as a membrane for the separation of molecules, the molecular permeability, which is one of the most important factors in molecular separation, is markedly reduced. When structure-directing agents other than TPAOH are used in the primary growth method, no MFI zeolite thin film grows on the substrate. To overcome such problems, the secondary growth method is used.

In the secondary growth method, a substrate having MFI zeolite crystals attached thereto is soaked in an MFI zeolite synthesis gel, and then allowed to react to form an MFI zeolite thin film. Herein, the MFI zeolite crystals attached to the substrate act as seeds. The orientation of the MFI zeolite crystals attached on the substrate plays a very important role in determining the orientation of the MFI zeolite thin film to be produced later. For example, when the a-axes of the MFI zeolite seed crystals are oriented perpendicular to the substrate, the a-axes of the MFI zeolite thin film formed therefrom tend to be oriented perpendicular to the substrate, and when the b-axes of the MFI zeolite seed crystals are oriented perpendicular to the substrate, the b-axes of the MFI zeolite thin film formed therefrom tend to be oriented perpendicular to the substrate.

However, the orientation of the resulting zeolite thin film is highly sensitive to a structure-directing agent contained in the synthesis gel added to form the thin film rather than to the orientation of the seed crystals. For example, the MFI synthesis gel which has been used in the secondary growth method usually contains TPAOH. In this case, even when the MFI zeolite seed crystals are attached to the substrate such that the a- or b-axis is oriented perpendicular to the substrate, the orientation of the resulting MFI zeolite thin film changes randomly.

Throughout the specification, a number of publications and patent documents are referred to and cited. The disclosure of the cited publications and patent documents is incorporated herein by reference in its entirety to more clearly describe the state of the related art and the present disclosure.

DISCLOSURE

Technical Problem

It is an object of the present invention to provide a novel method of forming a film by a simple preparation process without using a synthesis gel.

Another object of the present invention is to provide a film in which the orientations of the axes of seed crystals arranged on a substrate have been maintained.

Technical Solution

To achieve the above objects, the present invention provides a method for producing a thin film or a thick film, the method comprising the steps of: (1) providing a porous substrate capable of supplying silicon; (2) applying zeolite seed crystals to the surface of the porous substrate; (3) coating the porous substrate, having the seed crystals applied thereto, with an aqueous solution containing a structure-directing agent; and (4) forming and growing a film from the seed crystals by the secondary growth at or above a temperature at which moisture in the porous substrate, having applied thereto the seed crystals and prepared in step (3), is capable of forming steam.

The present invention also provides a film produced by the above production method.

Hereinafter, the present invention will be described in detail.

Step (1) of Providing a Porous Substrate Capable of Supplying Silicon

The present invention is characterized in that a porous substrate capable of supplying silicon is used in place of a synthesis gel as a silicon source in a secondary growth process.

The material of the porous substrate capable of supplying silicon is not particularly limited as long as it is capable of supplying silicon (Si). Preferably, the material is an amorphous porous material. As a non-limiting example, the material of the porous substrate is preferably an oxide containing silicon and having a hydroxyl group on the surface, and more preferably porous silica.

Non-limiting examples of the porous substrate capable of supplying silicon may include a molded material obtained by filling silica particles (preferably amorphous silica particles) into a mold and compressing the filled particles. The reason is that the substrate formed of porous amorphous particles has low crystallinity such that silicon can easily dissolve out of the substrate. For the same reason, the porosity of the porous substrate is preferably as high as possible.

Meanwhile, when a glass substrate as shown in FIG. 10A is used, the secondary growth does not readily occur because boron and aluminum dissolve out of the substrate.

A silicon wafer is preferably used as the porous substrate capable of supplying silicon, as long as an amorphous silicon oxide film is formed on the surface. The amorphous silicon oxide film on the silicon wafer is more easily formed in steam.

Meanwhile, the porous substrate is preferably used after swelling with water.

Step (2) of Applying Zeolite Seed Crystals to Surface of a Porous Substrate

The seed crystals that are used in the present invention and the skeletal component of a film formed therefrom are not particularly limited as long as they contain silicon.

The seed crystals and the formed film may be zeolites or zeotype molecular sieves. In addition, the seed crystals and the formed film may have an MFI structure.

As used herein, the term "zeolite" is meat to include (i) minerals that are aluminosilicate hydrates of alkali or alkaline earth metals, and (ii) zeotype molecular sieves in which silicon (Si) and aluminum (Al) atoms constituting the framework structure of zeolite are partially or wholly replaced by various other elements. In a broad sense, the term includes all porous oxides or sulfides having a hydroxyl group on the surface.

Examples of MFI zeolites or zeotype molecular sieves include ZSM-5, silicalite, TS-1, AZ-1, Bor-C, boralite C, encilite, FZ-1, LZ-105, monoclinic H-ZSM-5, mutinaite, NU-4, NU-5, TSZ, TSZ-III, TZ-01, USC-4, USI-108, ZBH, ZKQ-1B, etc.

In addition, examples of seed crystals are disclosed in Korean Patent Application Publication No. 2009-120846 and U.S. Pat. No. 7,357,836.

The seed crystals and the material of the porous substrate capable of supplying silicon are preferably made of the same material, and more preferably $SiO_2$.

The seed crystals are preferably ordered porous materials.

Meanwhile, the size of the seed crystals should be greater than the pores and voids of the porous substrate so that a portion or whole of the seed crystals protrudes from the surface of the porous substrate. In this case, the seed crystals can function as seed crystals in the production method of the present invention, and a film can be formed therefrom by a secondary growth method (FIGS. 12A-12D). In addition, the size of the seed crystals should be greater than the pores and voids of the porous substrate so that the seed crystals can lie flat on the surface of the porous substrate, and in this case, at least one axis of the seed crystals can be oriented in a particular direction, and a secondary film in which at least one crystal axis is oriented in a particular direction can be formed therefrom (FIG. 11).

In the specification, the relationship between the a-, b- and c-axes of crystals is that the c-axis does not lie on a plane on which the a-axis and the b-axis lie. For example, the a-, b- and c-axes of crystals may be perpendicular to one another, or the c-axis may have an angle with respect to the plane on which the a-axis and the b-axis lie.

In the present invention, when a film is formed and grown from seed crystals, attached to the porous substrate, by a secondary growth method, the seed crystals as a template for secondary growth may be arranged on the porous substrate such that one or more or all of the a-, b- and c-axes of anisotropic seed crystals are oriented according to a predetermined rule.

For example, the seed crystals may be arranged on the substrate in a manner such that all the a-axes of the seed crystals are oriented parallel to one another, or all the b-axes of the seed crystals are oriented parallel to one another, or all the c-axes of the seed crystals are oriented parallel to one another, or according to a combination thereof.

Moreover, the seed crystals may be arranged on the substrate such that the a-, b- or c-axes are oriented perpendicular to the surface of the substrate.

Meanwhile, seed crystals, arranged on a substrate such that one or more or all of the a-, b- and c-axes of the seed crystals are oriented according to a predetermined rule, preferably form a monolayer.

When all the orientations of the axes of the seed crystals are the same, the seed crystals are two-dimensionally connected to one another and/or grow perpendicular to the surface of the substrate, a single-crystal film, which is greater than single crystals and all the orientations of the axes of which are the same, can be formed. Herein, the size of the seed crystals may be on the order of $nm^3$ to $um^3$ scale, and the two-dimensional size of the film formed therefrom may be on the order of $mm^2$ to $cm^2$. Also, because the thickness of the film can further be increased, the three-dimensional size of the grown single-crystal film may be on the order of about $cm^3$ scale.

Meanwhile, in the present invention, the anisotropic crystal crystals arranged on the substrate may have the same or different shapes, as long as all the a-, b- and c-axes of the anisotropic crystal crystals are oriented according to a predetermined rule.

Korean Patent Application Publication No. 2009-120846 discloses a method of vertically orienting all the b-axes of MFI-type seed crystals on a substrate, and a technology capable of controlling the orientation of the a-, b- and/or c-axes of crystals on a substrate are disclosed in PCT/KR2010/002180 and PCT/KR2010/002181. Thus, seed crystals, arranged such that at least one or all of the a-, b- and c-axes of the seed crystals are oriented, can be prepared according to the methods described in Korean Patent Application Publication No. 2009-120846, PCT/KR2010/002180 and PCT/KR2010/002181 using a modification of these methods.

Specifically, seed crystals, arranged on a substrate such that all the a-, b- and c-axes thereof are oriented, can be prepared by the following processes:

Process 1

A process including the steps of:
A) preparing a substrate, the surface of which has formed thereon depressions or projections capable of fixing the position and orientation of seed crystals; and
B) placing seed crystals on the substrate, and then applying physical pressure to the seed crystals to insert a portion or the whole of each seed crystal into each of pores defined by the depressions or the projections.

Process 2

A process including the steps of:
(A) preparing a template, the surface of which has formed thereon depressions or projections capable of fixing the position and orientation of seed crystal;
(B) placing seed crystals on the template, and then applying physical pressure to the seed crystals to insert a portion or the whole of each seed crystal into each of pores defined by the depressions or the projections to thereby arrange the seed crystals on the template; and
(C) bringing the template having the seed crystals arranged thereon into contact with a substrate to transfer the seed crystals onto the substrate.

In the above processes, the shape of the pore preferably corresponds to the shape of a specific portion of each seed crystal which is inserted into the pore in order to control the orientations of the seed crystals.

Additionally, the physical pressure may be applied by rubbing or pressing against the substrate.

The depressions or projections formed on the substrate or the template can be printed directly on the substrate, or formed using photoresist, or formed by laser ablation after coating with a sacrificial layer, or formed by inkjet printing.

Although photoresist or ink may be removed after arranging the seed crystals on the substrate, it may also be present as a support for the seed crystals during the secondary growth process, as long as it causes no problem in the supply of silicon and a structure-directing agent to the seed crystals.

Meanwhile, the seed crystals inserted into the pores on the substrate or the template can be gathered to form a specific pattern or shape, and the film formed therefrom can also form a specific pattern or shape.

Before step (2), a coupling agent capable of binding to the substrate and the seed crystals may be applied to the substrate surface. As used herein, the term "a coupling agent" refers to any compound having a terminal functional group, which enables coupling between the substrate and the seed crystals. Preferred coupling agents and the mechanisms of action and applications thereof are disclosed in Korean Patent Application Publication No. 2009-120846 and U.S. Pat. No. 7,357,836.

Step (3) of Coating the Porous Substrate Having Seed Crystals Applied Thereto with an Aqueous Solution Containing a Structure-Directing Agent The present invention is characterized in that a porous substrate containing a material capable of supplying silicon is used as a silicon source when producing a film by a secondary growth method, and thus a gel-type silicon source is not required and a structure-directing agent is not supplied as a gel, but is supplied as an aqueous solution.

The structure-directing agent is a material functioning as a template for a particular crystalline structure, and the charge distribution, size and geometric shape of the structure-directing agent provide structure directing properties. The structure-directing agent that is used in the present invention is preferably a material that induces only secondary growth from the surface of seed crystals but does not induce crystal nucleation in a seed crystal growth solution or on the surface of seed crystals. The crystal growth rate according to each crystal axis is not critical as long as crystal nucleation is not induced.

Seed crystals that are used in step (2) can also be prepared using a seed structure-directing agent. Because the use of the seed structure-directing agent induces crystal nucleation, it is not preferable to use the seed structure-directing agent as a structure-directing agent for secondary growth. Thus, the structure-directing agent (SDA) that is used in step (3) preferably differs from the seed structure-directing agent.

When the seed crystals and the film formed therefrom are made of zeolite or zeotype molecular sieves, the structure-directing agent for secondary growth is preferably tetrapropylammonium hydroxide (TPAOH), tetraethylammonium hydroxide (TEAOH), tetramethylammonium (TMA), tetrabutylammonium (TBA), or a mixture of two or more thereof. Particularly, a mixture of TPAOH and TEACH is preferred.

The concentration of the structure-directing agent in an aqueous solution is in the range of 0.01-1 mole, preferably 0.1-0.5 moles, but is not limited thereto.

FIG. 8 is a set of SEM images showing films formed by secondary growth from silicalite-1 seed crystals, the b-axes of which were oriented perpendicular to porous silica ($SiO_2$) substrates, by performing a steaming reaction at 190° C. for 48 hours using aqueous solutions containing various concentrations of TEACH. As can be seen therein, the higher the concentration of TEACH increases, the more advantageous is the secondary growth by the steaming reaction.

Non-limiting examples of a method of coating the porous substrate having the seed crystals applied thereto with an aqueous solution containing the structure-directing agent may include slip-coating, spin coating, and spray coating. Slip coating is preferred (FIG. 5). For slip-coating, the substrate having the seed crystals applied thereto may be soaked in a structure-directing agent-containing aqueous solution in such a manner that only the surface is impregnated with the aqueous solution, and then the substrate may be taken out of the aqueous solution, and the surface having the seed crystals applied thereto may be faced upward so that the aqueous solution impregnated into the seed crystals move toward the porous substrate.

The process of coating the structure-directing agent-containing aqueous solution on the porous substrate having the seed crystals applied thereto may be repeated at least twice.

Step (4) of Forming and Growing a Film from the Seed Crystals by a Secondary Growth at a Temperature Equal to or Higher than a Temperature at which Steam in the Porous Substrate can Form Steam In step (4), the seed crystals vertically grow three-dimensionally from the seed crystal surface by secondary growth while the seed crystals are two-dimensionally connected to one another, thereby forming a film.

When the porous substrate impregnated with the structure-directing agent-containing aqueous solution by coating is heated in an autoclave, moisture in the porous substrate can form steam while transporting silicon and the structure-directing agent toward the seed crystals through the pores, whereby a film can be formed by secondary growth.

Step (4) is preferably performed in a state in which the seed crystal surface faces upward.

Moisture in the porous substrate can form a sufficient amount of steam.

In the film production method according to the present invention, silicon can be supplied from the porous substrate without using a synthesis gel, and the structure-directing agent for the secondary growth can be provided in the form of a solution. Thus, the unnecessary consumption of raw materials can be reduced, the waste of the synthesis gel is eliminated, and it does not require drying and washing of the film formed from the seed crystals.

In the method of the present invention, the temperature of the reaction for the formation and growth of the film may vary in the range from 50° C. to 250° C. depending on the composition of the structure-directing agent-containing aqueous solution or on the material to be made. The reaction temperature is preferably in the range of from 80° C. to 200° C., and more preferably from 180° C. to 190° C. In addition, the reaction temperature is not always fixed, but may be changed stepwise.

In the method of the present invention, the time of the reaction for the formation and growth of the film may vary from 0.5 hour to 20 days. The reaction time is preferably 2 hours to 15 days, and more preferably 40 to 50 hours.

When the film production method according to the present invention is used, single crystals, all the crystal axis orientations of which are the same and which are greater than the greatest diameter of single seed crystals parallel to the substrate surface can be formed while seed crystals are two-dimensionally connected to one another, by secondary growth from the surface of the seed crystals in an area in which all the orientations of the axes of the adjacent seed crystals are the same; or single crystals, all the crystal axis orientations of which are the same and which are greater than the greatest diameter of single seed crystals perpendicular to the substrate surface, can be formed while the seed crystals grow perpendicular to the substrate surface; or crystals satisfying the two conditions can be formed. For this purpose, it is preferred that crystal nucleation in step (4) does not occur on the seed crystal surface.

Meanwhile, when the seed crystals that are ordered porous materials have channels (nanopipes) formed therein, a film formed in an area in which the orientations of the axes of the adjacent seed crystals are the same, can extend the channels of the seed crystals therein.

For example, in the case of the film formed in the area in which the axis orientaions of the adjacent seed crystals are the same, the channel can continuously extend in the axial direction parallel to the substrate surface; or the channel can continuously extend in the axial direction perpendicular or inclined with respect to the substrate surface; or the two conditions can all be satisfied.

The film produced according to the present invention can be used in various applications, including membranes for molecular separation, low dielectric materials in the semiconductor industry, nonlinear optical materials, membranes for water electrolysis, thin films for solar cells, optical parts, interior and exterior parts for aircrafts, cosmetic containers, household containers, mirrors, and other membranes utilizing the characteristics of nanopores of zeolite, but is not limited thereto.

Advantageous Effects

The film production method according to the present invention consists of a simple production process, and thus has high reproducibility and high throughput. Also, a solution is used in place of a synthesis gel, the unnecessary consumption of raw materials can be reduced, environmental contamination can be reduced, the waste of the synthesis gel is eliminated, and it is not required to dry and wash the film.

In addition, the film production method according to the present invention can produce a film in which the orientations of the axes of seed crystals arranged on the porous substrate have been maintained.

According to the present invention, it is possible to form a film having channels formed in the directions perpendicular and parallel to the substrate surface. The film having nanochannels including various functional molecules, polymers, metal nanoparticles, or semiconductor quantum dots or quantum wires in a specific direction can be used as advanced materials for optical, electronic and photoelectronic applications. In particular, when films formed of porous alumina, porous silica or mesoporous materials have vertical channels, these films are highly useful as membranes for molecular separation.

0789661), in which the b-axes of the attached seed crystals are oriented perpendicular to the glass plate, but the a- and c-axes are oriented randomly.

Figure 4:
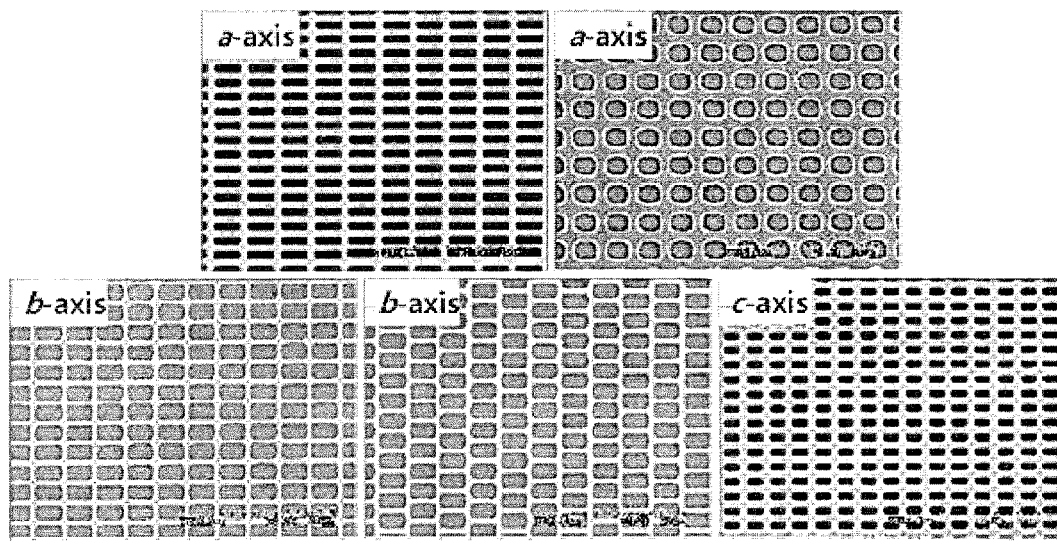

FIG. 4 is a set of SEM images of silicon wafers having micro-pattern depressions formed thereon using photoresist (PR) such that all the crystal axes can be uniformly oriented while each of the a-, b- and c-axes of the seed crystals can be oriented perpendicular to the wafer surface.

Figure 5:
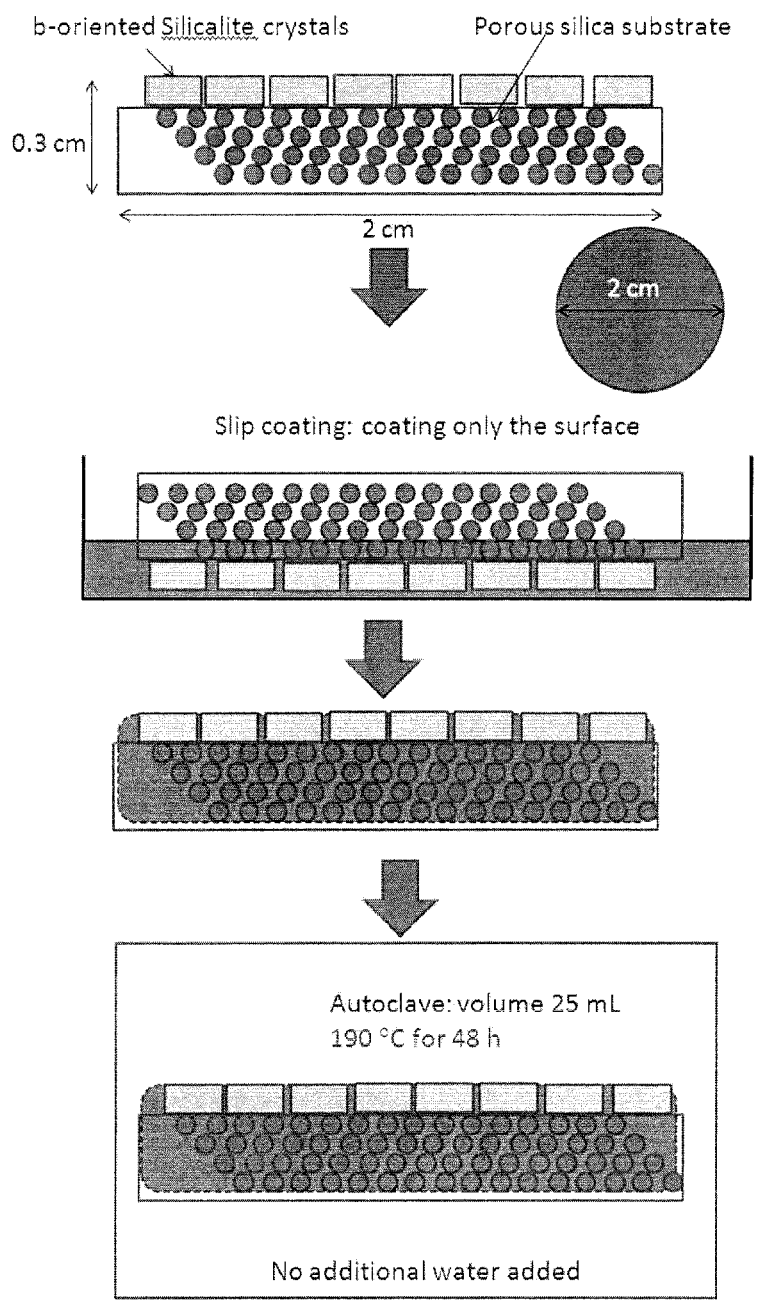

FIG. 5 is a schematic process view showing a film production method according to one embodiment of the present invention.

Figure 6A:
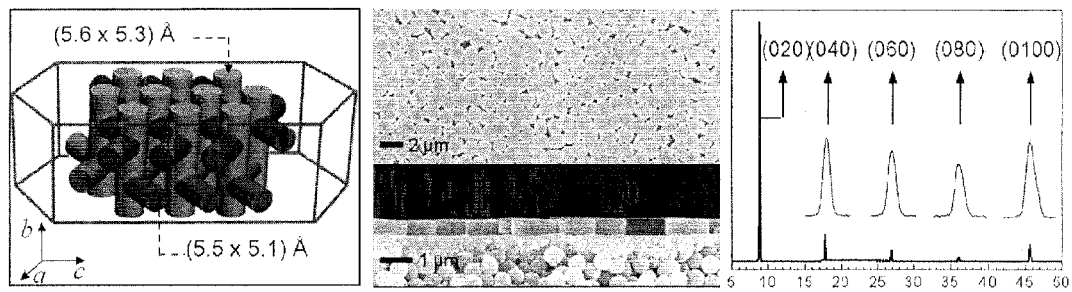

FIG. 6A shows an SEM image and XRD pattern of a crystal monolayer of silicalite-1 particles, the b-axes of which have been oriented perpendicular to a porous $SiO_2$ substrate.

Figure 6B:
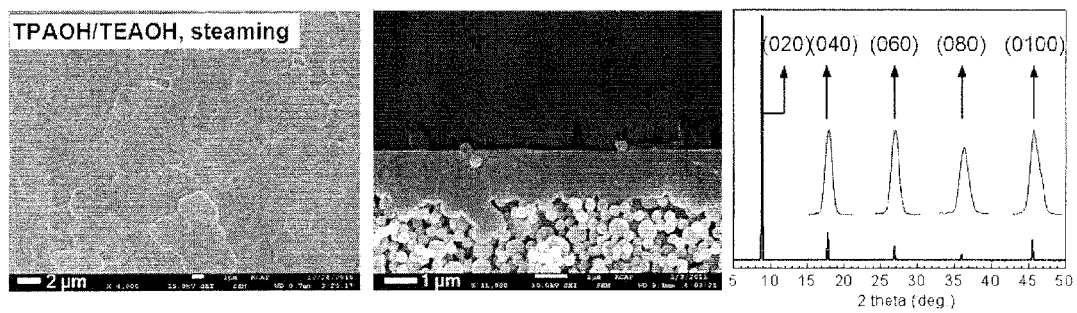

FIG. 6B shows an SEM image and XRD pattern of a thin film formed by the secondary growth using a porous substrate having the silicalite-1 crystal monolayer of FIG. 6A according to one embodiment of the present invention.

Figure 7:
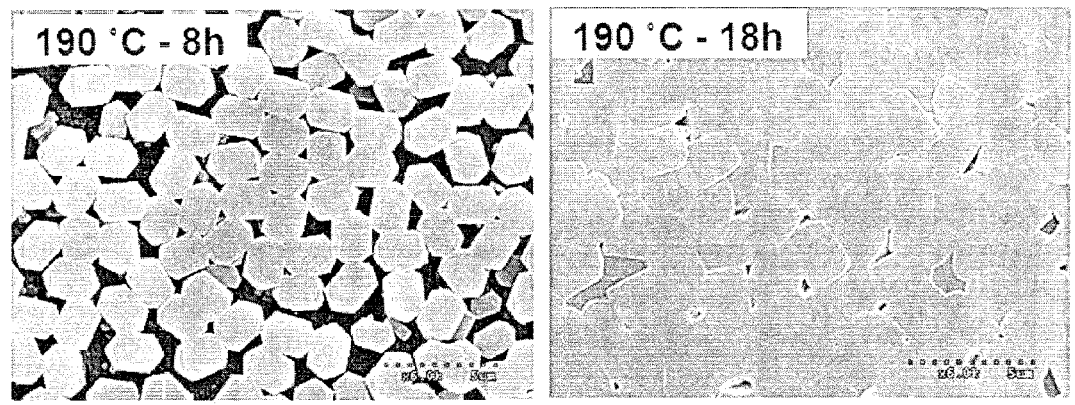

FIG. 7 is a set of SEM images of films formed by the secondary growth from silicalite-1 seed crystals, the b-axes of which were oriented perpendicular to porous silica ($SiO_2$) substrates, by performing a steaming reaction at 190° C. for various times using a TPAOH-containing aqueous solution according to the same embodiment as shown in FIG. 6B.

Figure 8:
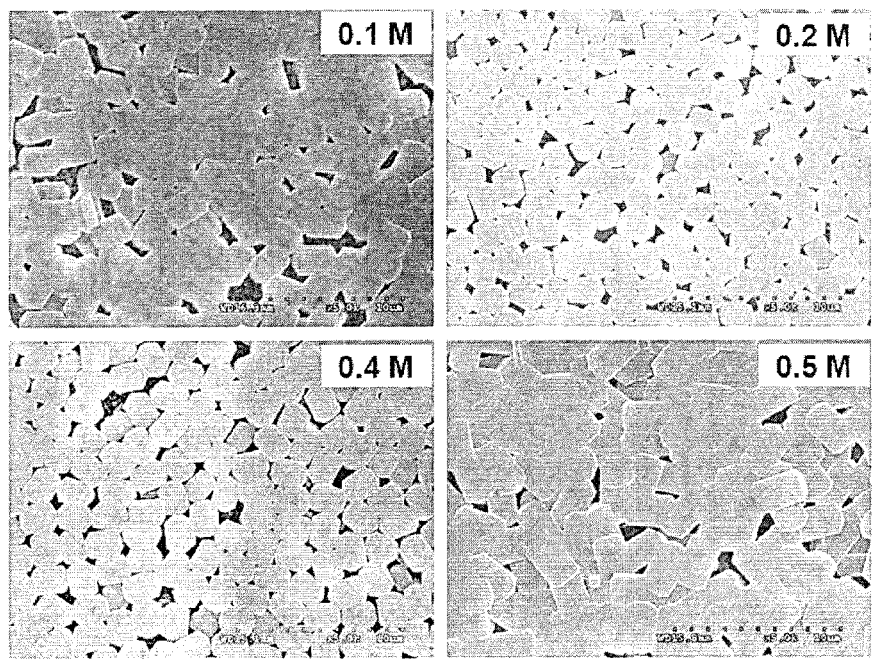

FIG. 8 is a set of SEM images of films formed by the secondary grown from silicalite-1 seed crystals, the b-axes of which were oriented perpendicular to porous silica ($SiO_2$) substrates, using aqueous solutions containing various concentrations of TPAOH by performing a steaming reaction at 190° C. for 48 hours.

Figure 9:
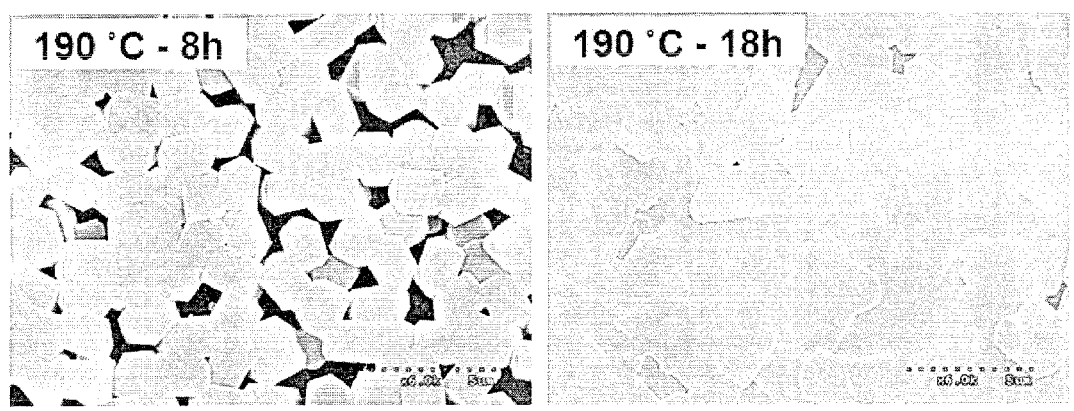

FIG. 9 is a set of SEM images of films formed by the secondary growth from silicalite-1 seed crystals, the b-axes of which were oriented perpendicular to porous silica ($SiO_2$) substrates, using an aqueous solution containing TPAOH and TEAOH and a steaming reaction at 190° C. for various times.

FIG. 10A is an SEM image of films formed by the secondary growth from silicalite-1 seed crystals, the b-axes of which were oriented perpendicular to a glass substrate, using an aqueous solution containing TPAOH and TEAOH and a steaming reaction at 190° C. for 48 hours; FIG. 10B is an SEM image of films formed by the secondary growth from silicalite-1 seed crystals, the b-axes of which were oriented perpendicular to a silicon wafer, using an aqueous solution containing TPAOH and TEAOH and a steaming reaction at 190° C. for 48 hours. When the glass substrate was used (FIG. 10A), secondary growth did not easily occur.

FIG. 11 is a set of SEM images of silicalite membranes (images B to D) formed by the secondary growth of silicalite nanoparticles (image A) having a size of 800 nm on porous silica ($SiO_2$) substrates (surface particle size: 500-600 nm) and a steaming reaction at 190° C. for various times. The structure-directing agent used is an aqueous solution containing TPAOH and TEAOH.

The size of the seed crystals is similar to the size scale of particles forming the porous substrate surface, and thus a secondary membrane, the crystal axes of which have been oriented randomly, is formed. Accordingly, only when the average particle size of seed crystals is 2-3 μm, the seed crystals can lie flat on a porous substrate, and thus at least one axis of the seed crystals can be oriented perpendicular to the substrate, and a secondary membrane, at least one crystal axis of which has been oriented perpendicular to the substrate, can be formed from the seed crystals.

FIG. 12A is an SEM image of a porous silica substrate (surface particle size: 500-600 nm); FIG. 12B is an SEM image of a smooth surface after rubbing 70 nm $SiO_2$ beads; FIG. 12C is an SEM image of a film formed by secondary growth using an aqueous solution containing TEAOH and TPAOH and a steaming reaction at 190° C. for 48 hours; and FIG. 12D is an XRD pattern of the film shown in FIG. 12C. From FIG. 12D, it can be seen that no new crystals were formed.

FIG. 13 is a graphic diagram showing the void area (%) of zeolite films (SL membranes) as a function of react ion time, when the zeolite films were produced by secondary growth in steam at 190° C. using different structure-directing agents (TEAOH, TPAOH+TEAOH, and TPAOH) without using a gel-type silicon source, according to the present invention. Void area % means a portion of the substrate, on which zeolite is not located. When the aqueous solution containing the TPAOH structure-directing agent was used, the zeolite film grew fastest, and the growth rate of the zeolite film was faster in the order of use of the TPAOH+ TEAOH structure-directing agent-containing aqueous solution and use of the TEAOH structure-directing agent-containing aqueous solution.

Figure 14:
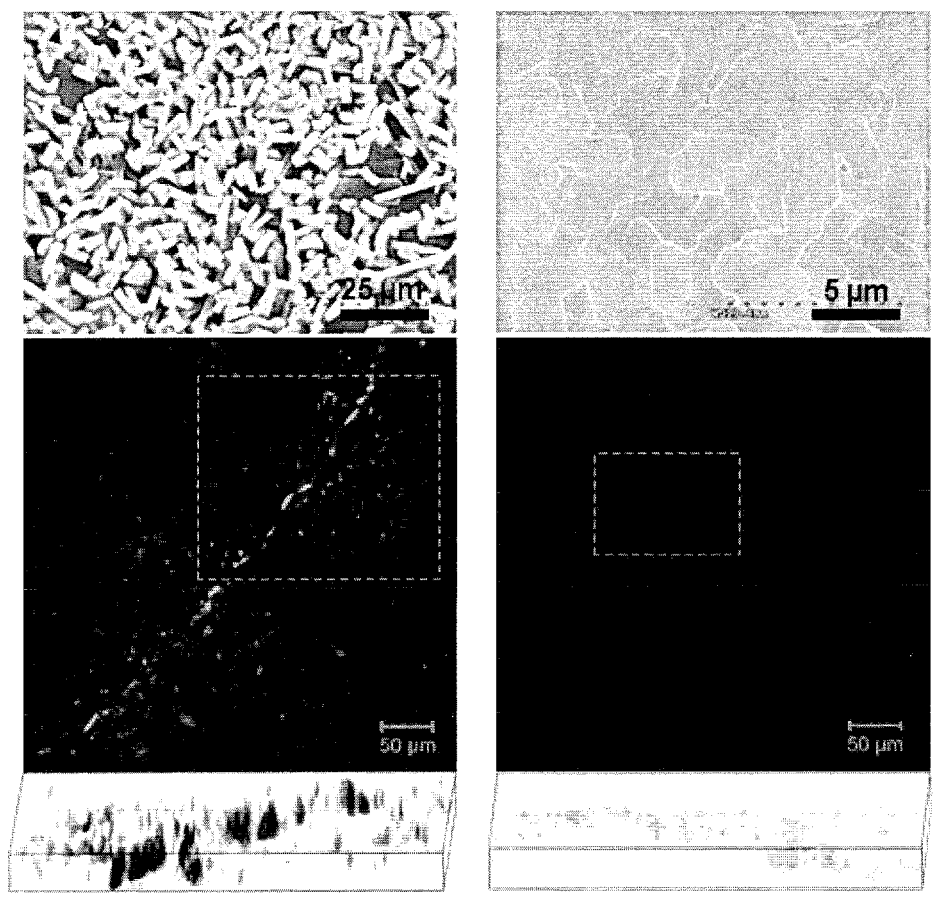

The left photograph of FIG. 14 shows a randomly oriented MFI zeolite thin film produced by a conventional method of growing a zeolite film using an MFI synthesis gel. It can be seen that fluorescence was observed in cracks, because the cracks occurred in the calcining step for removal of TPAOH during the production process. On the other hand, the right photograph shows a film, the crystal axis orientations of which have been maintained uniformly, produced by the method of the present invention without using a synthesis gel. In this case, no fluorescence was observed, because no crack occurred and the film grew uniformly (observed by Plan-Apochromat 20×/0.8 M27, zoom: 1.0, mater gain: 585, laser: 488 nm, 2.6%).

Figure 15:
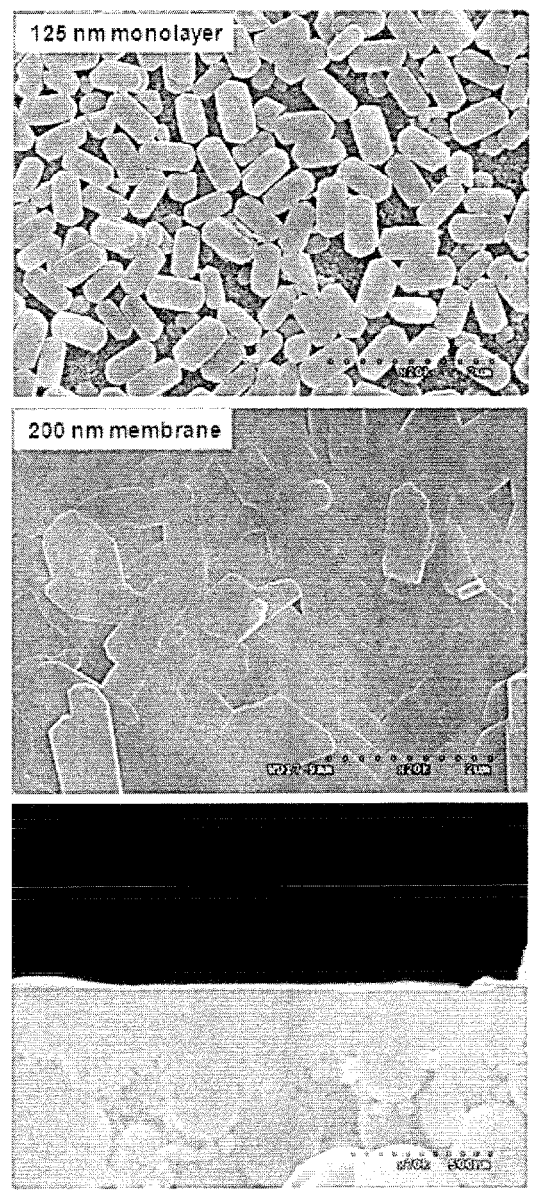

FIG. 15 shows that a zeolite thin film, one axis of which has been oriented vertically, can be grown into a 200 nm thin film using steam under synthesis gel-free conditions according to the method of the present invention.

Figure 16:
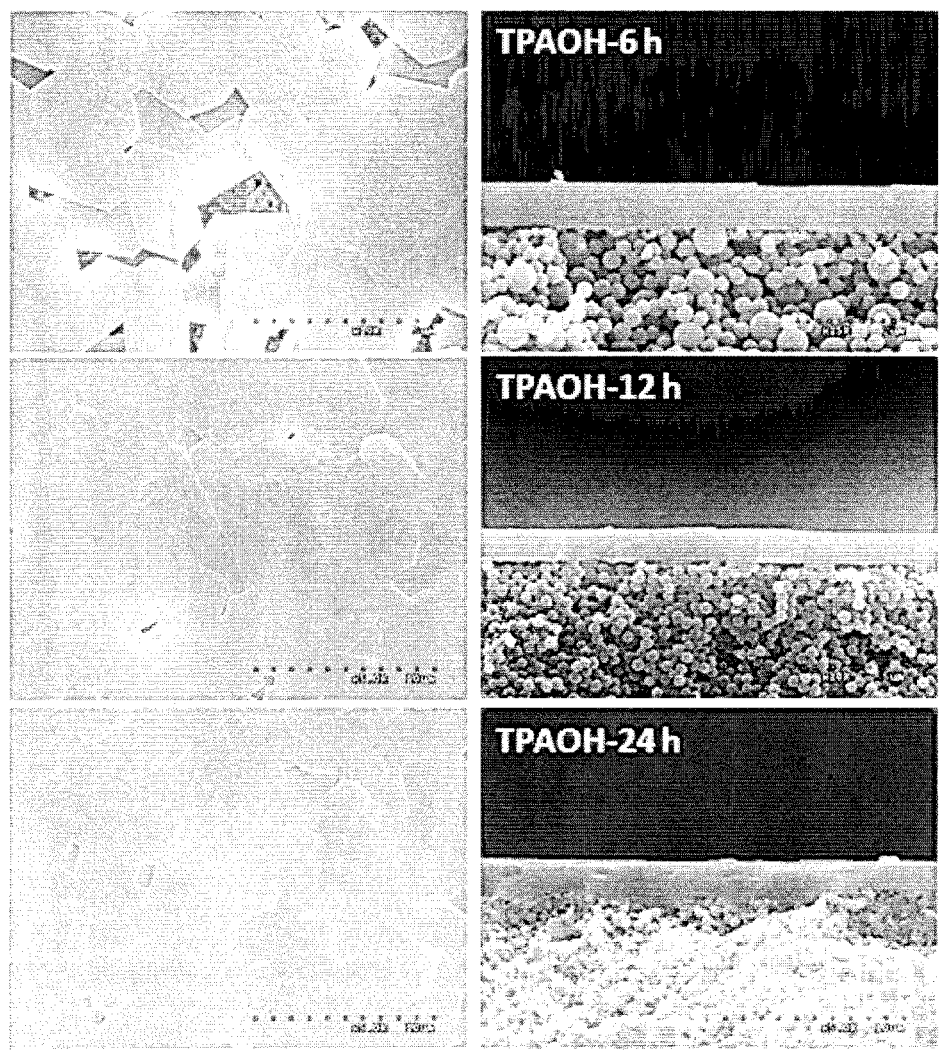

FIG. 16 is a set of SEM images showing the results of observing the growth of a film as a function of time, when zeolite seed crystals were applied to a molded material (that is a porous substrate capable of supplying silicon according to the present invention) obtained by filling amorphous silica particles into a mold and compressing the filled particles, and were then subjected to secondary growth using an aqueous solution containing the TPAOH structure-directing agent.

Figure 17:
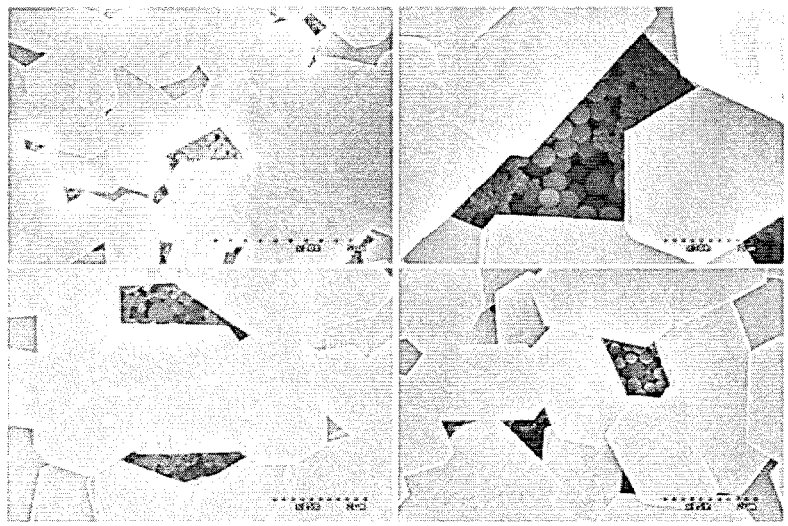

FIG. 17 is a set of SEM images showing that silica beads supply silicon for the growth of seed crystals while being etched during a streaming reaction, when zeolite seed crystals were placed on a molded material (that is a porous substrate capable of supplying silicon according to the present invention) obtained by filling 50 nm silica ($SiO_2$) beads into a mold and compressing the filled beads, and were then subjected to secondary growth using a steaming reaction.

Figure 18:
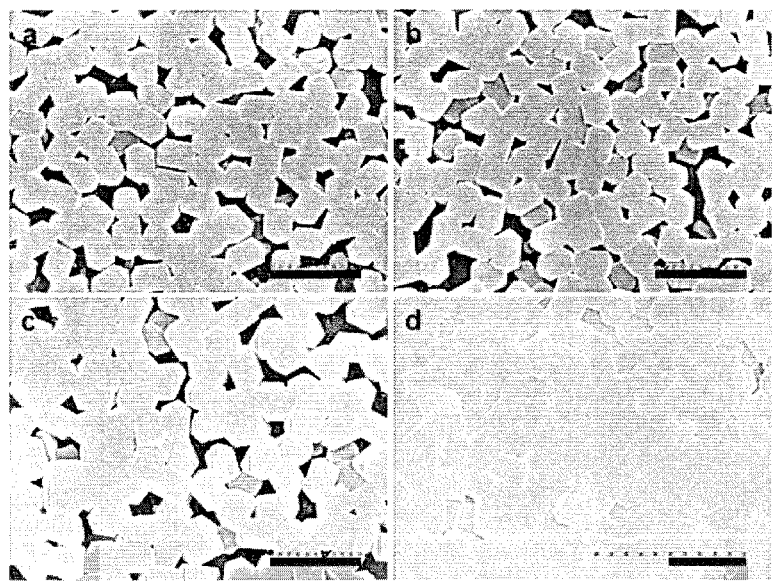

FIG. 18 is a set of SEM images showing silicalite (SL) films formed on silica particle supports by secondary growth using a TPAOH TEACH structure-directing agent-containing aqueous solution and a steaming reaction at different reaction temperatures for different reaction times. (a) 160° C. for 8 hr, (b) 175° C. for 8 hr, (c) 190° C. for 8 hr, and (d) 190° C. for 18 hr. Scale bar: 5 μm.

Figure 19:
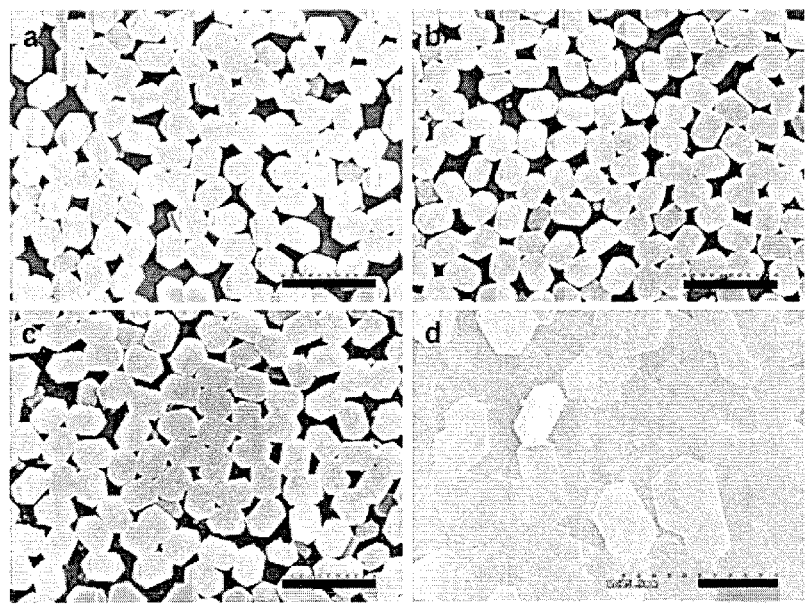

FIG. 19 is a set of SEM images showing silicalite (SL) films formed on silica particle supports by secondary growth using a TPAOH structure-directing agent-containing aqueous solution and a steaming reaction at different reaction temperatures for different reaction times. (a) 160° C. for 8 hr, (b) 175° C. for 8 hr, (c) 190° C. for 8 hr, and (d) 190° C. for 18 hr. Scale bar: 5 μm.

Figure 20:
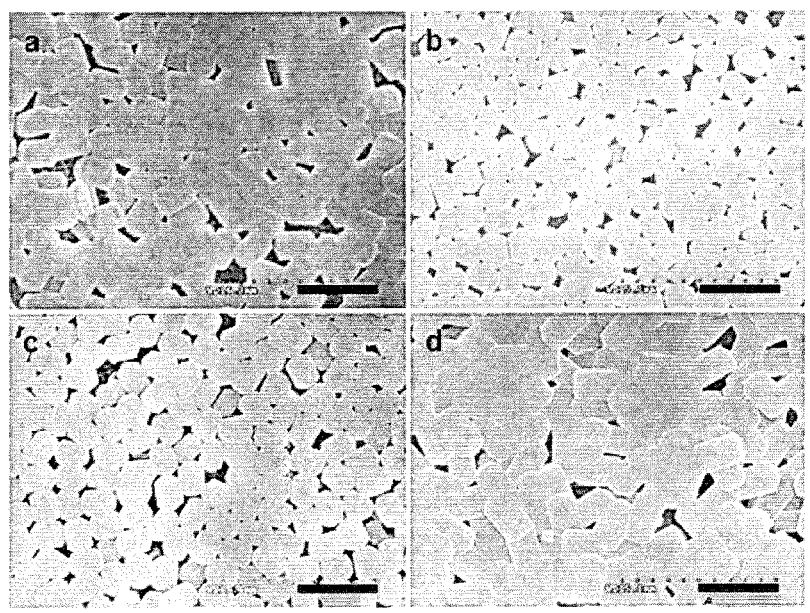

FIG. 20 is a set of SEM images showing silicalite (SL) films on silica particle supports by secondary growth using aqueous solutions containing various concentrations (0.01M (a), 0.02M (b), 0.04M (c), and 0.05M (d)) and a steaming reaction at 190° C. for 48 hours.

Figure 21:
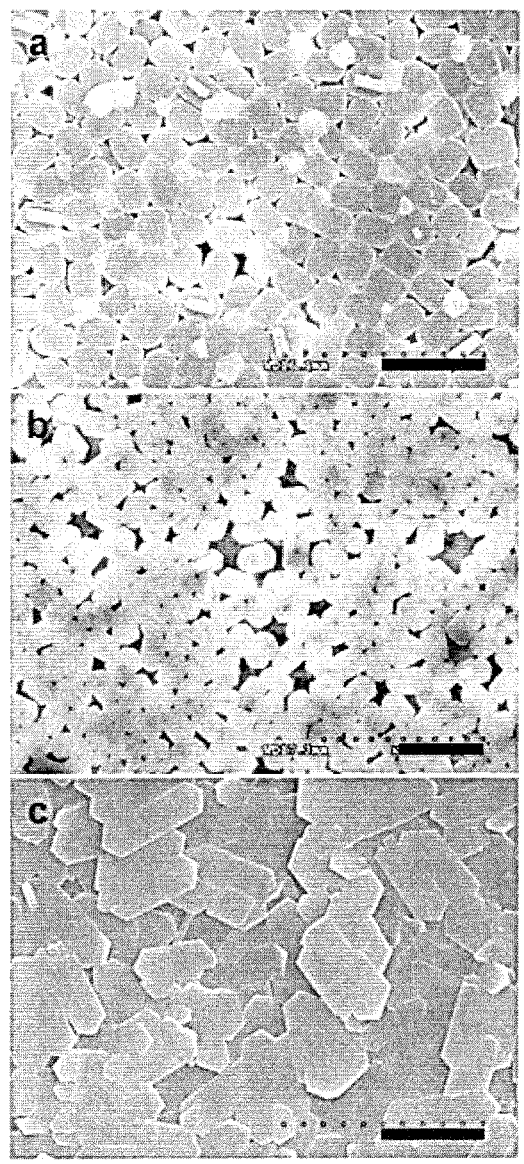

FIG. 21 is a set of SEM images showing silicalite films formed on a glass support (a), a cleaned silicon wafer (b) and an amorphous $SiO_2$-coated silicon wafer by secondary growth using an aqueous solution containing a TPAOH+TEAOH structure-directing agent and a steaming reaction at 190° C. for 48 hours. Scale bar: 5 μm.

MODE FOR INVENTION

Hereinafter, the present invention will be described in further detail with reference to examples. It will be obvious to those skilled in the art that these examples are for illustrative purposes only and are not intended to limit the scope of the present invention.

Scanning Electron Microscope (SEM) Analysis

Platinum/palladium was coated on a produced thin film to a thickness of about 15 nm and imaged by a scanning electron microscope (Hitachi S-4300 FE-SEM) to obtain an SEM image.

X-Ray Powder Diffraction (XRD) Analysis

In order to examine the crystal orientations of thin films produced in the following examples, X-ray powder diffraction patterns were obtained by an X-ray diffractor (Rigaku diffractor D/MAX-1C, Rigaku) using CuKα X-rays.

Example 1: Synthesis of Seed Crystals

Experimental Materials

TPAOH 35% (Alfa), TPAOH 1M (Sigma-Aldrich), $(NH_4)_2SiF_6$ 98% (Sigma-Aldrich), and tetraethylorthosilicate (TEOS 98%, Acros-Organic).

Figure 1:
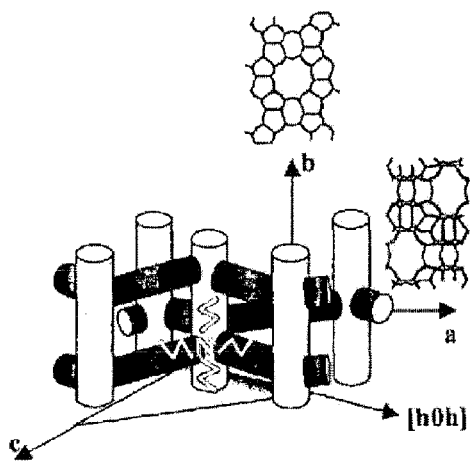
FIG. 1 schematically shows MFI crystals having a structure-directing agent inserted therein.
Figure 2:
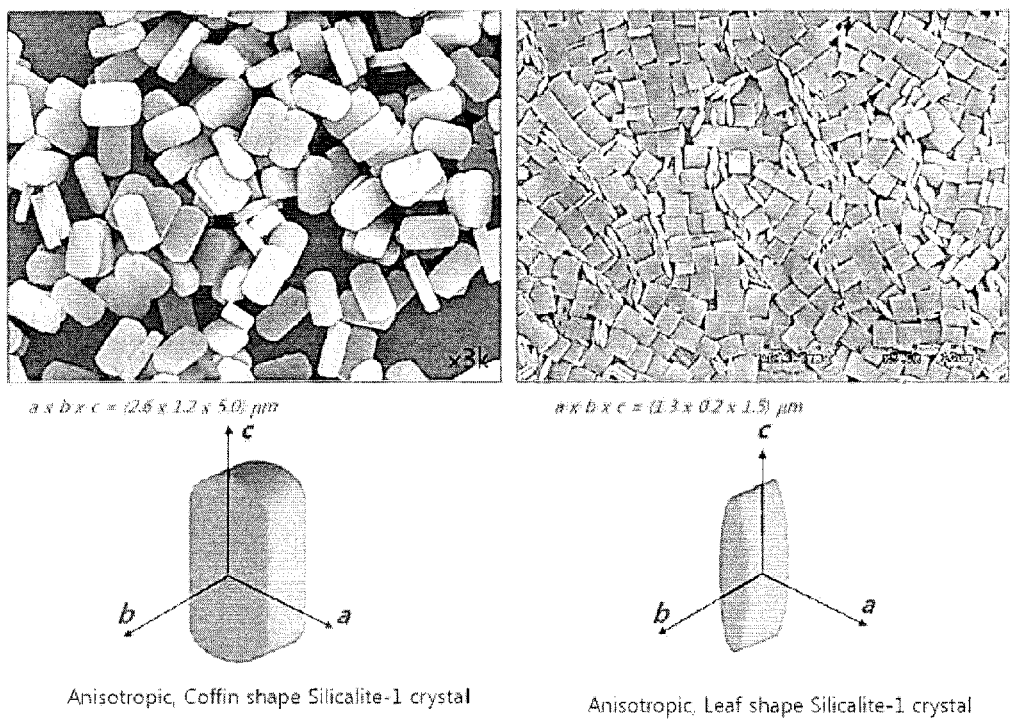
FIG. 2 shows SEM images of anisotropic coffin-shaped silicalite-1 crystals and anisotropic leaf-shaped silicalite-1 crystals and the crystal axes thereof. The left SEM image shows coffin-shaped silicalite-1 crystals, and the right SEM image shows anisotropic leaf-shaped silicalite-1 crystals.
Figure 3:
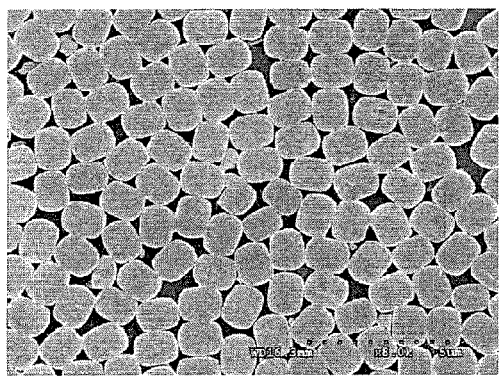
FIG. 3 is an electron micrograph (an image viewed from the top) of a glass plate having silicalite-1 seed crystals attached thereto using a rubbing method (Korean Patent No.

Example 1-1: Anisotropic Coffin-Shaped Silicalite-1 Crystals 22.5 g of TEOS was added to a PP bottle containing 247.7 mL of DDW, 22.5 mL of TPAOH and 37.2 g of ethylene glycol (EG) to prepare a gel. The mixture was stirred for 24 hours to form a clear gel, and then 6.168 mL of TEACH was added thereto and stirred for 12 hours. The obtained clear gel had a final molar composition of 1 TEOS/0.15 TPAOH/0.1 TEACH/4 EtOH/100 $H_2O$/4 EG. After aging, the gel was filtered through Whatman Grade No. 2 filter paper and transferred into a Teflon-lined autoclave equipped with a clean stirring bar. The autoclave was sealed, heated by jacket heater at 150° C. and stirred with a magnetic stirrer at 500 rpm. After a hydrothermal reaction for 12 hours, the autoclave was cooled in tap water. The clean solution in the upper layer was removed by decantation, thereby obtaining a solid product. The solid product was washed with a large amount of DDW and dried at 100° C. for 24 hours, thereby obtaining coffin-shaped silicalite-1 seeds having a size of a×b×c=2.6 μm×1.2 μm×5.0 μm (see FIG. 2).

Example 1-2: Anisotropic Leaf-Shaped Silicalite-1 Crystals

The reaction conditions described in the paper Angew. Chem. Int. Ed., 2006, 45, 1154-1158 were used. 1.696 g of TEOS was added to a PP bottle containing 1.019 g of Trimer-$TPA^{3+}$-$3I^-$, 0.295 g of KOH and 34.2 g of DDW to prepare a clean gel. The obtained gel had a final molar composition of 8 TEOS/1 (Trimer-$TPA^{3+}$-$3I^-$)/5 KOH/1900 $H_2O$. After aging for 24 hours, the gel was filtered through Whatman Grade No. 2 filter paper and transferred into a Teflon-lined autoclave. The gel was subjected to a hydrothermal reaction at 175° C. for 24 hours. The product was collected, washed with a large amount of DDW and dried at 100° C. for 24 hours, thereby obtaining leaf-shaped silicalite-1 powder (see FIG. 2).

Example 2: Preparation of Porous Silica Substrate

Silica particles having a size ranged from 50 nm to 500 nm, synthesized according to the method of Stober (W. Stober et al. J. Colloid Interface Sci. 26, 62 1968), were used to prepare a porous silica substrate.

Specifically, 10 g of 350 nm $SiO_2$ beads and 10 g of 550 nm $SiO_2$ beads were mixed with each other in a food mixer. 0.5 wt % $Na_2SiO_3$ aqueous solution (DDW) was added dropwise to the mixed silica beads, which were then ground in a food mixer. 1.8 g of the mixture was placed in a household stainless mold and compressed with a pressure of 150 kgf/$cm^2$ to prepare a porous silica support. The silica support was sintered at 1,025° C. at a heating rate of 100° C./h for 2 hours. After cooling to room temperature, both surfaces of the porous silica disc were polished with SiC sandpaper (Presi, grit size P800). To make the surface smooth, both surfaces of the porous silica disc were re-polished with SiC sandpaper (Presi, grit size P1200). The diameter and thickness of the porous silica disc were 20 mm and 3 mm, respectively. The porous silica disc had an average pore size of 250 nm and a porosity of 45.5% as measured by a mercury porosimeter.

A drop of DDW was added dropwise to the porous silica disc. Meanwhile, 70 nm silica beads were prepared and sintered at 550° C. for 24 hours. The porous silica disc was rubbed with the sintered 70 nm silica beads until the surface became glossy, whereby large cracks in the porous silica substrate made from the 350 nm beads were filled with the sintered beads. The resulting porous silica substrate having a smooth surface was dried overnight at room temperature and sintered in a muffle furnace at 550° C. for 8 hours. The temperature was increased to 550° C. for 8 hours and decreased to room temperature for 4 hours. An acetone solution of epoxy resin (10 wt %) was spin-coated on the porous silica substrate at 3,000 rpm for 15 seconds and cured at 80° C. for 30 minutes. The epoxy coating functions to prevent seed crystals from being randomly inclined by cracks of the porous substrate surface when the seed crystals are to be arranged later on the porous substrate surface in a predetermined direction.

Example 3: Production of Silicalite Monolayer on Porous Silica Substrate by Rubbing An ethanol solution of polyethyleneimine (PEI, 0.1 wt %) was spin-coated on the epoxy-coated porous silica substrate at a spin speed of 2,500 rpm for 15 seconds. Silicalite crystals (1.0×0.5×1.4 $μm^3$) were placed on the porous silica substrate and rubbed with the finger so that the silicalite crystals were aligned into a monolayer such that the b-axes were completely oriented (FIG. 6A). The silicalite crystal monolayer supported on the porous silica substrate is expressed as SLM/p-$SiO_2$. The SLM/p-$SiO_2$ substrate was sintered in air in a tubular furnace at 550° C. for 24 hours, whereby the organic polymer layer was removed and the silicalite monolayer on the porous silica substrate was fixed by formation of Si—O—Si bonds. The temperature was increased at a rate of 65° C./h and decreased at a rate of 100° C./h.

The sintered SLM/p-SiO$_2$ substrate was allowed to stand in a chamber at a specific humidity so that the substrate absorbed H$_2$O in order for steam to be easily formed from moisture of the porous substrate in a subsequent process. The hydrated SLM/p-SiO$_2$ substrate was soaked in NH$_4$F solution (0.2 M) for 5 hours in order to remove fine powder that came out of the seed crystals by the rubbing process. The NH$_4$F-treated SLM/p-SiO$_2$ substrate was soaked in fresh DDW for 1 hour and dried at room temperature for 24 hours.

Example 4: Formation and Growth of Film by Secondary Growth from Silicalite Seed Crystals, the b-Axes of which have been Completely Oriented An aqueous solution of a mixture of TEACH (0.00-0.05 M) and TPAOH (0.00-0.05 M) as a structure-directing agent (template) was placed in a plastic beaker.

Specifically, an aqueous solution of TEACH, an aqueous solution of TPAOH and TEACH, and an aqueous solution of TPAOH were used.

The SLM/p-SiO$_2$ substrate was coated with the above-described structure-directing agent by a slip-coating process in the following manner (see FIG. 5). Specifically, the clean SLM/p-SiO$_2$ substrate was brought into gentle contact with the structure-directing agent containing solution. Herein, the silicalite monolayer surface was faced downward, and about ½ of the thickness of the porous silica substrate was soaked in the structure-directing agent containing solution. After soaking for 10-20 seconds, the SLM/p-SiO$_2$ substrate was lifted slowly. This process was repeated three times. After coating with the structure-directing agent, the SLM/p-SiO$_2$ substrate was kept horizontally in a Petri dish at room temperature for 5 second to remove an excess of water.

Finally, the SLM/p-SiO$_2$ substrate coated with the structure-directing agent was transferred into a Teflon-lined autoclave in such as manner that the silicalite monolayer faced upward. A secondary growth reaction was performed without adding a synthesis gel or water. Specifically, the closed autoclave was placed in a preheated oven. The reaction was performed at a temperature of from 160° C. to 190° C. for 18-48 hours. After a predetermined reaction time, the autoclave was cooled in tap water.

The resulting film was taken out of the autoclave and allowed to stand at room temperature for from 6 to 12 hours. Next, it was sintered in air at 440° C. for 8 hours to remove the structure-directing agent. Herein, the heating rate was 60° C./h, and the cooling rate was 90° C./h.

An SEM image and XRD pattern of the thin film obtained by secondary growth using the porous SiO$_2$ substrate having the silicalite crystal monolayer as described above are shown in FIG. 6B.

In addition, the zeolite thin film could be produced as a thin film having a thickness of 200 nm by controlling the reaction time and temperature in the above-described production step (FIG. 15).

Test Example 1: Test for Uniformity of Film Formed by Secondary Growth

A randomly oriented MFI zeolite thin film produced by a conventional method of growing zeolite using an MFI synthesis gel was observed with a fluorescence microscope (Plan-Apochromat 20×/0.8 M27, zoom: 1.0, mater gain: 585, laser: 488 nm, 2.6%). In the thin film produced by the conventional method, fluorescence was observed in cracks, because the cracks occurred in the calcining step for removal of TPAOH during the production process.

On the other hand, in the film, the crystal axis orientations of which have been maintained uniformly, prepared by the method of the present invention without using a synthesis gel, no fluorescence was observed, because no crack occurred and the film grew uniformly (FIG. 14).

Although the present invention has been described in detail with reference to the specific features, it will be apparent to those skilled in the art that this description is only for a preferred embodiment and does not limit the scope of the present invention. Thus, the substantial scope of the present invention will be defined by the appended claims and equivalents thereof.

The invention claimed is:
1. A method for producing a film, the method comprising the steps of:
   (1) providing a porous substrate capable of supplying silicon;
   (2) applying zeolite seed crystals to the surface of the porous substrate;
   (3) coating the porous substrate, having the seed crystals applied thereto, with an aqueous solution containing a structure-directing agent, which does not contain a silicon source; and
   (4) forming and growing a film from the seed crystals by a secondary growth at or above a temperature at which moisture in the porous substrate, having applied thereto the seed crystals and prepared in step (3), is capable of forming steam.

2. The method of claim 1, wherein the material of the porous substrate capable of supplying silicon is an amorphous porous material.

3. The method of claim 1, wherein the material of the porous substrate capable of supplying silicon is porous silica.

4. The method of claim 1, wherein the porous substrate in step (1) is swollen with water.

5. The method of claim 1, wherein the seed crystals and the formed film are made of zeolite or zeotype molecular sieve.

6. The method of claim 5, wherein the zeolite or the zeotype molecular sieve has an MFI structure.

7. The method of claim 5, wherein the zeolite or the zeotype molecular sieve is selected from the group consisting of ZSM-5, silicalite, TS-1, AZ-1, Bor-C, boralite C, encilite, FZ-1, LZ-105, monoclinic H-ZSM-5, mutinaite, NU-4, NU-5, TSZ, TSZ-III, TZ-01, USC-4, USI-108, ZBH, and ZKQ-1B.

8. The method of claim 1, wherein the size of the seed crystals is greater than the size of pores and voids of the porous substrate so that the seed crystals lie flat on the surface of the porous substrate.

9. The method of claim 1, wherein the silicon-containing seed crystals in step (2) are arranged on the porous substrate so that one or more or all of the a-, b- and c-axes of the seed crystals are oriented according to a predetermined rule.

10. The method of claim 9, wherein the seed crystals in step (2) are arranged in a manner such that all the a-axes of the seed crystals are oriented parallel to one another, or all the b-axes of the seed crystals are oriented parallel to one another, or all the c-axes of the seed crystals are oriented parallel to one another, or according to a combination thereof.

11. The method of claim 10, wherein the seed crystals in step (2) are arranged such that the a-, b- or c-axes are oriented perpendicular to the substrate surface.

12. The method of claim 9, wherein the seed crystals, one or more or all of the a-, b- and c-axes of which have been oriented according to the predetermined rule, form a monolayer on the substrate in step (2).

13. The method of claim 1, wherein the seed crystals in step (4) are two-dimensionally connected to one another by the secondary growth from the seed crystal surface while they vertically grow three-dimensionally, thereby forming the film.

14. The method of claim 1, wherein the formed film has a thickness of 100 nm to 500 nm.

15. The method of claim 1, wherein the structure-directing agent used in step (3) is tetrapropylammonium hydroxide (TPAOH), tetraethylammonium hydroxide (TEAOH), tetramethylammonium (TMA), tetrabutylammonium (TBA), or a mixture of two or more thereof.

16. The method of claim 1, wherein the structure-directing agent used in step (3) is a material inducing only the secondary growth from the surface of the seed crystals but not capable of inducing crystal nucleation on the surface of the seed crystals.

17. The method of claim 1, wherein the seed crystals are ordered porous materials.

18. The method of claim 9, wherein the seed crystals are applied to the porous substrate such that at least the b-axes are oriented according to the predetermined rule, and the film, formed in an area in which the orientations of the b-axes of the adjacent seed crystals are the same, has either a channel continuously extending in an axial direction parallel to the substrate surface or a channel extending in an axial direction perpendicular or inclined with respect to the substrate surface.

19. The method of claim 1, wherein step (3) and step (4) are repeated at least twice.

* * * * *